(12) United States Patent
Miyasaka et al.

(10) Patent No.: US 8,105,759 B2
(45) Date of Patent: Jan. 31, 2012

(54) PHOTOSENSITIVE RESIN COMPOSITION, AND, PHOTOSENSITIVE ELEMENT, METHOD FOR FORMING RESIST PATTERN, METHOD FOR MANUFACTURING PRINTED WIRING BOARD AND METHOD FOR MANUFACTURING PARTITION WALL FOR PLASMA DISPLAY PANEL USING THE COMPOSITION

(75) Inventors: Masahiro Miyasaka, Hitachi (JP); Takashi Kumaki, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 79 days.

(21) Appl. No.: 11/994,990

(22) PCT Filed: Jan. 3, 2006

(86) PCT No.: PCT/JP2006/313245
§ 371 (c)(1),
(2), (4) Date: Apr. 2, 2009

(87) PCT Pub. No.: WO2007/004619
PCT Pub. Date: Jan. 11, 2007

(65) Prior Publication Data
US 2009/0202944 A1 Aug. 13, 2009

(30) Foreign Application Priority Data
Jul. 5, 2005 (JP) ................. P2005-196596

(51) Int. Cl.
*G03F 7/40* (2006.01)
*G03F 7/20* (2006.01)
*G03F 7/004* (2006.01)

(52) U.S. Cl. ..... 430/313; 430/315; 430/318; 430/275.1; 430/281.1; 430/285.1; 430/920; 430/926; 430/286.1

(58) Field of Classification Search .................. None
See application file for complete search history.

(56) References Cited

U.S. PATENT DOCUMENTS

| 3,697,280 A * | 10/1972 | Strilko ................ 430/270.1 |
| 5,994,002 A | 11/1999 | Matsuoka |
| 6,159,652 A | 12/2000 | Sato et al. |
| 6,180,319 B1 * | 1/2001 | McKeever ............... 430/311 |
| 7,566,665 B2 | 7/2009 | Inoue et al. |
| 7,897,896 B2 | 3/2011 | Jyousaka et al. |
| 7,897,897 B2 | 3/2011 | Jyousaka et al. |
| 2004/0235985 A1 * | 11/2004 | Ichimura et al. ........ 523/200 |
| 2006/0079721 A1 * | 4/2006 | Honda et al. ............ 568/633 |
| 2006/0188814 A1 * | 8/2006 | Sakata ................ 430/270.1 |
| 2007/0178246 A1 | 8/2007 | Biro et al. |
| 2009/0297982 A1 * | 12/2009 | Saitou et al. .......... 430/286.1 |

FOREIGN PATENT DOCUMENTS

| JP | 4-195043 A | 7/1992 |
| JP | 11-199681 A | 7/1999 |
| JP | 11-327137 A | 11/1999 |
| JP | 2000-344704 A | 12/2000 |
| JP | 2002-365815 A | 12/2002 |
| JP | 2003-257310 A | 9/2003 |
| JP | 2005-107191 A | 4/2005 |
| JP | 2005-128508 A | 5/2005 |
| JP | 2005-321587 A | 11/2005 |
| WO | WO-2005/097495 A1 * | 10/2005 |

OTHER PUBLICATIONS

Crivello et al "Anthracene electron-transfer photosnsitizers for onium salt induced cationci photopolymerizations", Journal of photochemistry and Photobiology A; Chemistry vol. 159, 2003, pp. 173-188.*
Monroe et al "Photoinitiators for Free-Radical Initiated Photoimaging Systems", Chem. Rev. 1993, pp. 435-448.*
English Translation of the International Preliminary Report on Patentability (IPRP—Chapter1) Issued on Jan. 17, 2008 in the Corresponding International Application No. PCT/JP2006/313245.
Patterning technology for the next generation of printed wiring boards using maskless exposure to shorten development time and enable mass production, Electronic Packaging Technology, Jun. 2002, vol. 18, No. 6, pp. 74-79.

International Search Report Issued in the Corresponding International Application No. PCT/JP2006/313245, Completed on Jul. 16, 2006 and Mailed on Jul. 25, 2006.
Webster's Ninth New Collegiate Dictionary 270 (1990), p. 270.
Hawley's Condensed Chemical Dictionary 302 (1987), p. 302.

* cited by examiner

*Primary Examiner* — Cynthia Hamilton
(74) *Attorney, Agent, or Firm* — Griffin & Szipl, P.C.

(57) ABSTRACT

A photosensitive resin composition comprising (A) a binder polymer, (B) a photopolymerizing compound with a polymerizable ethylenic unsaturated bond, (C) a photoradical polymerization initiator containing a 2,4,5-triarylimidazole dimer or its derivative, and (D) a compound represented by the following general formula (1)

[Chemical Formula 1]

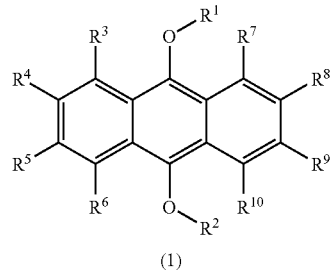

(1)

(wherein $R^1$ and $R^2$ each independently represent C1-20 alkyl, etc., and $R^3$, $R^4$, $R^5$, $R^6$, $R^7$, $R^8$, $R^9$ and $R^{10}$ each independently represent hydrogen, etc.).

2 Claims, 1 Drawing Sheet ial layer to form a barrier pattern and the resist pattern is
PHOTOSENSITIVE RESIN COMPOSITION, AND, PHOTOSENSITIVE ELEMENT, METHOD FOR FORMING RESIST PATTERN, METHOD FOR MANUFACTURING PRINTED WIRING BOARD AND METHOD FOR MANUFACTURING PARTITION WALL FOR PLASMA DISPLAY PANEL USING THE COMPOSITION This is a National Phase Application in the United States of International Patent Application No. PCT/JP2006/313245 filed Jul. 3, 2006, which claims priority on Japanese Patent Application No. 2005-196596, filed Jul. 5, 2005. The entire disclosures of the above patent applications are hereby incorporated by reference.

TECHNICAL FIELD

The present invention relates to a photosensitive resin composition, and to a photosensitive element, a resist pattern forming method, a printed circuit board production process and a plasma display panel barrier production process that use it.

BACKGROUND ART

Resist materials used for etching or plating with conventional printed circuit board manufacturing technology include widely employed photosensitive elements obtained using photosensitive resin compositions, or the same laminated onto supports and covered with protective films.

For ordinary production of printed circuit boards, first a photosensitive element is stacked (by lamination or the like) onto a circuit-forming board such as a copper board with a layer composed of a photosensitive resin composition (hereinafter referred to as "photosensitive layer") bonded thereto, and irradiated with active light rays for photocuring (pattern exposure) of prescribed sections of the photosensitive resin composition, after which the non-photocured sections of the photosensitive resin composition are removed to form a resist pattern (development). Finally, a pattern is formed by etching or plating of the circuit-forming board on which the resist pattern is to be formed, and the photocured sections of the photosensitive resin composition are then released and removed from the board.

In the field of flat panel displays (FPD), it is known that plasma display panels (PDP) are capable of faster display than liquid crystal panels and can be upsized more easily. Because of these advantages, PDPs have become widely used as OA devices and public display devices. Further advancement of PDPs for the field of high definition television in the future is also foreseen.

With such diversifying uses, a great deal of interest is being drawn toward color PDPs comprising numerous fine display cells. In a PDP, the front glass panel and the back glass panel are situated parallel and opposite to each other, and a barrier is provided at an equal spacing between them. The PDP has a construction whereby discharge occurs in the space surrounding the front glass panel, back glass panel and barrier. Electrodes, a dielectric material layer and a fluorescent material are included in the space for display. The fluorescent material is induced to emit light by ultraviolet rays emitted from the filler gas by the discharge, and this light is visible to the viewer. In order to limit the extent of discharge to a specific region and ensure a uniform discharge space while producing display within the specified cell, the barrier has a shape with a width of 20-80 μm and a height of 60-200 μm.

The method usually employed for forming the barrier is a sand blast method, screen printing method, photosensitive paste method, photo-casting method or mold transfer method. Methods of formation by wet etching processes have also been proposed in recent years.

For production of a barrier, for example, a barrier material layer is formed on a back glass panel on which an electrode has been formed and a photosensitive element is stacked (by lamination or the like) onto the photosensitive layer comprising the photosensitive element bonded to the barrier material layer, after which it is irradiated with active light rays for photocuring (pattern exposure) of prescribed sections of the photosensitive resin composition and the non-photocured sections of the photosensitive resin composition are then removed (developed) to form a resist pattern. Finally, the resist pattern is used as a mask for etching of the barrier material layer to form a barrier pattern and the resist pattern is released and removed.

Mercury lamps have conventionally been used as light sources for pattern exposure of photosensitive layers. However, mercury lamp light includes ultraviolet rays that are harmful to the human body, and therefore worker safety has been an issue. Methods of exposure also exist that use visible light lasers as light sources, but such methods require resists that are sensitive to visible light and which must therefore be handled in darkrooms or under red lamps.

In light of such problems, it has been proposed to use active light rays emitted from mercury lamp light sources from which 99.5% of the light with a wavelength of 365 nm and shorter has been cut using a filter. In recent years it has also been proposed to employ gallium nitride-based blue laser light sources that have long usable life and high output, and oscillate light with a wavelength of 405 nm.

Other proposals in recent years involving new exposure techniques include direct writing methods such as DLP (Digital Light Processing) (for example, see Non-patent document 1). The light sources employed in these exposure methods are also mercury lamp light sources as active light sources with 99.5% of the light with a wavelength of 365 nm cut out using a filter, or blue laser light sources.

[Non-patent document 1] Electronics Packaging Technology, June 2002, p. 74-79.

DISCLOSURE OF THE INVENTION

Problems to be Solved by the Invention

Conventional photosensitive elements, however, are designed to exhibit optimal photoexposure properties for the total wavelength of mercury lamp light sources which are centered around a wavelength of 365 nm. Consequently, when it is attempted to accomplish pattern exposure using light with a peak in a wavelength range of between 350 nm and 440 nm, the sensitivity of a photosensitive element for the light with a peak in the wavelength range of 350 nm to 440 nm is low. Such resist pattern formation has therefore been associated with low throughput and insufficient resolution, making it impossible to obtain satisfactory resist forms.

It is an object of the present invention to provide a photosensitive resin composition that allows formation of resist patterns with light having a peak in the wavelength range of 350 nm to 440 nm at sufficient sensitivity and resolution, as well as a photosensitive element, resist pattern forming method, printed circuit board production process and plasma display panel barrier production process using it.

Means for Solving the Problems

The present inventors have completed this invention after finding that the problems mentioned above can be solved by a photosensitive resin composition containing specific amounts of specified components.

The photosensitive resin composition of the invention comprises (A) a binder polymer, (B) a photopolymerizing compound with a polymerizable ethylenic unsaturated bond, (C) a photoradical polymerization initiator containing a 2,4,5-triarylimidazole dimer or its derivative, and (D) a compound represented by the following general formula (1).

[Chemical Formula 1]

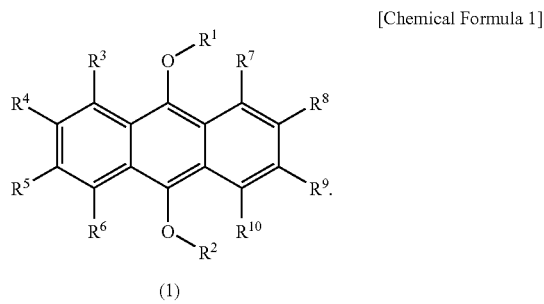

(1)

In formula (1), $R^1$ and $R^2$ each independently represent a C1-20 alkyl, C5-12 cycloalkyl, phenyl, benzyl, C2-12 alkanoyl or benzoyl group. $R^3$, $R^4$, $R^5$, $R^6$, $R^7$, $R^8$, $R^9$ and $R^{10}$ (hereinafter, "$R^3$-$R^{10}$") each independently represent hydrogen, C1-12 alkyl, a halogen atom, cyano, carboxyl, phenyl, C2-6 alkoxycarbonyl or benzoyl. When the aforementioned C1-20 alkyl group is a C2-12 alkyl group, it may have an oxygen atom between the main chain carbon atoms, and may be substituted with hydroxyl. The C5-12 cycloalkyl group may have an oxygen atom in the ring and may be substituted with hydroxyl. A phenyl group for $R^1$ and $R^2$ may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl. A benzyl group may be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl. A benzoyl group may also be substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl.

The photosensitive element of the invention is further provided with a photosensitive layer comprising a support and the aforementioned photosensitive resin composition formed on the support.

Conventional photosensitive elements have had low sensitivity and resolution for light with a peak wavelength range between 390 nm and 440 nm. This is mainly because conventional photosensitive elements have low optical density for this wavelength range, or in other words are unable to sufficiently absorb light in the wavelength range, such that it is difficult to initiate polymerization of the (B) photopolymerizing compound in the photosensitive element. It is a feature of the photosensitive resin composition of the invention that it contains (D) a compound represented by general formula (1) in a specified amount. The photosensitive element of the invention is also constructed using a photosensitive layer that contains a specified amount of (D) a compound represented by general formula (1). The (D) compound represented by general formula (1) in the photosensitive element has a high optical absorption characteristic for light with a wavelength of 390 nm to 440 nm. When using light having a peak in the wavelength range of 390 nm to 440 nm as the exposure light, therefore, it is possible to achieve sufficient sensitivity and resolution and a satisfactory resist form. The (D) compound represented by general formula (1) in the photosensitive element also has a high optical absorption characteristic for light with a wavelength of 350 nm to 390 nm. It is therefore possible to achieve sufficient sensitivity and resolution and a satisfactory resist form even when using the total wavelength range of light from a mercury lamp light source, which is centered around light with a wavelength of 365 nm as the exposure light.

In the (D) compound represented by general formula (1) in the photosensitive resin composition, $R^1$ and $R^2$ represent C1-4 alkyl groups and $R^3$-$R^{10}$ represent hydrogen.

The photosensitive resin composition is useful for formation of resist patterns by exposure to light having a peak in the wavelength range of 350 nm to 440 nm.

The resist pattern forming method of the invention comprises a photosensitive layer forming step in which a photosensitive layer made of the photosensitive resin composition is formed on a board, an exposure step in which prescribed sections of the photosensitive layer are exposed to light having a peak in the wavelength range of 350 nm to 440 nm, and a developing step in which the exposed photosensitive layer is developed to form a resist pattern.

The resist pattern forming method of the invention may also comprise a photosensitive layer forming step in which the photosensitive layer of a photosensitive element is laminated on a board, an exposure step in which prescribed sections of the photosensitive layer are exposed to light having a peak in the wavelength range of 350 nm to 440 nm, and a developing step in which the exposed photosensitive layer is developed to form a resist pattern.

The printed circuit board production process of the invention comprises a photosensitive layer forming step in which a photosensitive layer made of the photosensitive resin composition is formed on a board, an exposure step in which prescribed sections of the photosensitive layer are exposed to light having a peak in the wavelength range of 350 nm to 440 nm, a developing step in which the exposed photosensitive layer is developed to form a resist pattern, and a conductor pattern forming step in which a conductor pattern is formed on the board based on the resist pattern.

The printed circuit board production process of the invention may also comprise a photosensitive layer forming step in which the photosensitive layer of a photosensitive element is laminated on a board, an exposure step in which prescribed sections of the photosensitive layer are exposed to light having a peak in the wavelength range of 350 nm to 440 nm, a developing step in which the exposed photosensitive layer is developed to form a resist pattern, and a conductor pattern forming step in which a conductor pattern is formed on the board based on the resist pattern.

The plasma display panel barrier production process of the invention comprises a photosensitive layer forming step in which a photosensitive layer made of the photosensitive resin composition is formed on a board, an exposure step in which prescribed sections of the photosensitive layer are exposed to light having a peak in the wavelength range of 350 nm to 440 nm, a developing step in which the exposed photosensitive layer is developed to form a resist pattern, and a barrier pattern forming step in which a barrier pattern is formed on the board by etching, based on the resist pattern.

The plasma display panel barrier production process of the invention may also comprise a photosensitive layer forming step in which the photosensitive layer of a photosensitive element is laminated on a board, an exposure step in which prescribed sections of the photosensitive layer are exposed to light having a peak in the wavelength range of 350 nm to 440 nm, a developing step in which the exposed photosensitive layer is developed to form a resist pattern, and a barrier pattern forming step in which a barrier pattern is formed on the board by etching, based on the resist pattern.

Effect of the Invention

According to the invention there are provided a photosensitive resin composition that allows formation of resist patterns with light having a peak in the wavelength range of 350 nm to 440 nm at sufficient sensitivity and resolution, and a photosensitive element, resist pattern forming method, printed circuit board production process and plasma display panel barrier production process using it.

EXPLANATION OF SYMBOLS

Figure 1:
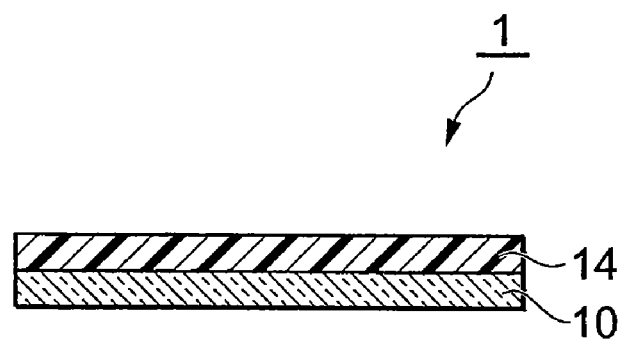
FIG. 1 is a schematic cross-sectional view showing an embodiment of a photosensitive element of the invention.

1: Photosensitive element, 10: support film, 14: photosensitive layer.

BEST MODES FOR CARRYING OUT THE INVENTION

Preferred embodiments of the invention will now be described in detail. However, the present invention is not limited to the embodiments described below.

The photosensitive resin composition of the invention contains (A) a binder polymer (hereinafter referred to as "component (A)"), (B) a photopolymerizing compound with a polymerizable ethylenic unsaturated bond (hereinafter referred to as "component (B)"), (C) a photoradical polymerization initiator (hereinafter referred to as "component (C)") and (D) a compound represented by general formula (1) above (hereinafter referred to as "component (D)"). Components (A)-(D) will now be explained in detail.

Component (A) of the invention is not particularly restricted so long as it is a polymer that is photocurable with the photopolymerizing compound described hereunder. As examples of component (A) there may be mentioned acrylic-based resins containing (meth)acrylic acid and alkyl(meth)acrylate as structural units, or organic polymers such as styrene-based resins, epoxy-based resins, amide-based resins, amide/epoxy-based resins, alkyd-based resins, phenol-based resins and the like. Among these, component (A) is preferably one obtained by polymerization (radical polymerization, etc.) of a monomer with an ethylenic unsaturated double bond (polymerizable monomer), and from the viewpoint of improving the developing property and releasability, it is more preferably an acrylic-based resin containing (meth) acrylic acid and alkyl(meth)acrylate as structural units.

As examples of monomers with ethylenic unsaturated double bonds there may be mentioned styrene; polymerizable styrene derivatives such as vinyltoluene, α-methylstyrene, p-methylstyrene, p-ethylstyrene, p-methoxystyrene, p-ethoxystyrene, p-chlorostyrene and p-bromostyrene; acrylamides such as diacetoneacrylamide; acrylonitrile; esters of vinyl alcohols such as vinyl-n-butyl ether; (meth)acrylic acid-based monomers such as (meth)acrylic acid alkyl esters, tetrahydrofurfuryl(meth)acrylate ester, dimethylaminoethyl (meth)acrylate ester, diethylaminoethyl(meth)acrylate ester, glycidyl (meth)acrylate ester, 2,2,2-trifluoroethyl(meth) acrylate, 2,2,3,3-tetrafluoropropyl(meth)acrylate, (meth) acrylic acid, α-bromo(meth)acrylic acid, α-chlor(meth) acrylic acid, β-furyl(meth)acrylic acid and β-styryl(meth) acrylic acid; maleic acid-based monomers such as maleic acid, maleic acid anhydride, monomethyl malate, monoethyl malate and monoisopropyl malate; and fumaric acid, cinnamic acid, α-cyanocinnamic acid, itaconic acid, crotonic acid, propiolic acid and the like, among which (meth)acrylic acid alkyl esters and styrene or styrene derivatives are preferred.

The term "(meth)acrylic acid" as used with regard to the invention means acrylic acid or its corresponding methacrylic acid, (meth)acrylate means acrylate or its corresponding methacrylate, and (meth)acryloyl group means acryloyl or its corresponding methacryloyl group.

As examples of (meth)acrylic acid alkyl esters there may be mentioned compounds represented by the following general formula (2), and the same compounds with the alkyl groups substituted with hydroxyl, epoxy, halogen atoms or the like.

$$CH_2=C(R^{11})-COOR^{12} \qquad (2)$$

In formula (2), $R^{11}$ represents hydrogen or methyl and $R^{12}$ represents a C1-12 alkyl group.

As examples of C1-12 alkyl groups represented by $R^{12}$ in general formula (2) there may be mentioned methyl, ethyl, propyl, butyl, pentyl, hexyl, heptyl, octyl, nonyl, decyl, undecyl, dodecyl and their structural isomers. As examples of compounds represented by general formula (2) there may be mentioned methyl(meth)acrylate ester, ethyl(meth)acrylate ester, propyl(meth)acrylate ester, butyl (meth)acrylate ester, pentyl(meth)acrylate ester, hexyl(meth)acrylate ester, heptyl (meth)acrylate ester, octyl(meth)acrylate ester and 2-ethylhexyl(meth)acrylate ester. These may be used alone or in combinations of two or more.

A binder polymer used as component (A) is preferably composed of one or more polymers with carboxyl groups, from the standpoint of the alkali developing property. Such a binder polymer (A) may be obtained, for example, by radical polymerization of a carboxyl group-containing polymerizable monomer with another polymerizable monomer.

From the viewpoint of obtaining a photosensitive layer having the photosensitive resin composition as the structural material and exhibiting both satisfactory adhesiveness and releasability with respect to the circuit-forming board, the binder polymer used as component (A) preferably contains styrene or a styrene derivative as a polymerizable monomer.

When component (A) contains styrene or a styrene derivative as a copolymerizing component, the content of the styrene or styrene derivative is preferably 3-30 wt %, more preferably 4-28 wt % and most preferably 5-27 wt % based on the total molecular weight. If the content is less than 3 wt % the adhesiveness will tend to be inferior, and if it is greater than 30 wt % the release strip will be increased in size, tending to lengthen the release time.

The term "styrene derivative" according to the invention means styrene wherein a hydrogen has been substituted with a substituent (an organic group such as alkyl, or a halogen atom or the like).

Binder polymers as component (A) are used alone or in combinations of two or more. As examples of binder polymers when two or more are used in combination, there may be mentioned two or more binder polymers composed of different copolymerizing components, two or more binder polymers with different weight-average molecular weights, and two or more binder polymers with different dispersibilities. There may also be used a polymer having a multimode molecular weight distribution, as described in Japanese Unexamined Patent Publication HEI No. 11-327137.

The weight-average molecular weight (Mw) and number-average molecular weight (Mn) of the binder polymer as component (A) may be measured by gel permeation chromatography (GPC) (calculated with a calibration curve using standard polystyrene). Based on this manner of measurement, the Mw of the binder polymer is preferably 5000-300,000, more preferably 20,000-150,000 and most preferably 25,000-60,000. An Mw of less than 5000 will tend to result in lower developing solution resistance, and greater than 300,000 will tend to lengthen the developing time.

The binder polymer as component (A) has a dispersibility (Mw/Mn) of preferably 1.0-3.0 and more preferably 1.0-2.0. A dispersibility of greater than 3.0 will tend to lower the adhesiveness and resolution.

The content of component (A) is preferably 20-80 parts by weight and more preferably 30-70 parts by weight with respect to 100 parts by weight as the total of component (A) and component (B). A content of less than 20 parts by weight will tend to render the photocured sections of the photosensitive layer fragile, and result in poor coated film properties when used as a photosensitive element. A content exceeding 80 parts by weight will tend to result in inadequate photosensitivity.

The photopolymerizing compound having a polymerizable ethylenic unsaturated bond in the molecule (hereinafter referred to as "photopolymerizing compound") as component (B) will now be explained. Component (B) of the invention is not particularly restricted so long as it is a photopolymerizable compound with a polymerizable ethylenic unsaturated bond in the molecule, and the following photopolymerizing compounds may be mentioned as examples.

Specifically, component (B) of the invention may be a compound obtained by reacting an $\alpha,\beta$-unsaturated carboxylic acid with a polyhydric alcohol; a bisphenol A-based (meth)acrylate compound; a compound obtained by reacting an $\alpha,\beta$-unsaturated carboxylic acid with a glycidyl group-containing compound; an urethane monomer such as a (meth) acrylate compound with an urethane bond in the molecule; nonylphenoxypolyethyleneoxy acrylate; a phthalic acid-based compound; a (meth)acrylic acid alkyl ester, or the like. These may be used alone or in combinations of two or more.

From the viewpoint of more reliably achieving the effect of the invention, it is preferred to use a combination of a photopolymerizing compound with one polymerizable ethylenic unsaturated bond in the molecule, and a photopolymerizing compound with two or more polymerizable ethylenic unsaturated bonds in the molecule.

The photopolymerizing compound as component (B) preferably contains a bisphenol A-based (meth)acrylate compound or a (meth)acrylate compound with a urethane bond in the molecule as essential components, from the viewpoint of plating resistance and adhesiveness.

According to the invention, a bisphenol A-based (meth)acrylate compound is a compound with both (meth)acryloyl or a (meth)acryloyl-derived carbon-carbon unsaturated double bond, and a bisphenol A-derived —$C_6H_4C(CH_3)_2$—$C_6H_4$— group.

As examples of the aforementioned compounds obtained by reacting $\alpha,\beta$-unsaturated carboxylic acids with polyhydric alcohols there may be mentioned polyethyleneglycol di(meth)acrylate having 2-14 ethylene groups, polypropyleneglycol di(meth)acrylate having 2-14 propylene groups, polyethylene/polypropyleneglycol di(meth)acrylate, trimethylolpropane di(meth)acrylate, trimethylolpropane tri(meth)acrylate, EO-modified trimethylolpropane tri(meth) acrylate, PO-modified trimethylolpropane tri(meth)acrylate, EO,PO-modified trimethylolpropane tri(meth)acrylate, tetramethylolmethane tri(meth)acrylate, tetramethylolmethane tetra(meth)acrylate, dipentaerythritol penta(meth)acrylate, dipentaerythritol hexa(meth)acrylate having 2-14 ethylene groups and 2-14 propylene groups, and the like. These may be used alone or in combinations of two or more.

"EO" stands for ethylene oxide, and an EO-modified compound has a block structure of ethylene oxide groups. "PO" stands for propylene oxide, and a PO-modified compound has a block structure of propylene oxide groups.

As examples of bisphenol A-based (meth)acrylate compounds there may be mentioned 2,2-bis(4-((meth)acryloxypolyethoxy)phenyl)propanes, 2,2-bis(4-((meth)acryloxypolypropoxy)phenyl)propanes, 2,2-bis(4-((meth)acryloxypolybutoxy)phenyl)propanes and 2,2-bis(4-((meth)acryloxypolyethoxypolypropoxy)phenyl)propanes.

As examples of 2,2-bis(4-((meth)acryloxypolyethoxy)phenyl)propanes there may be mentioned 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane. Of these, 2,2-bis(4-(methacryloxypentaethoxy)phenyl)propane is commercially available as BPE-500 (product of Shin-Nakamura Chemical Co., Ltd.), and 2,2-bis(4-(methacryloxypentadecaethoxy)phenyl)propane is commercially available as BPE-1300 (product of Shin-Nakamura Chemical Co., Ltd.).

The number of ethylene oxide (EO) groups per molecule in the aforementioned 2,2-bis(4-((meth)acryloxypolyethoxy) phenyl)propane is preferably 4-20 and more preferably 8-15. These may be used alone or in any desired combinations of two or more.

As (meth)acrylate compounds having urethane bonds in the molecule there may be mentioned addition reaction products of (meth)acrylic monomers having OH groups at the $\beta$-position, with diisocyanate compounds (isophorone diisocyanate, 2,6-toluene diisocyanate, 2,4-toluene diisocyanate, 1,6-hexamethylene diisocyanate, etc.), as well as tris((meth) acryloxytetraethyleneglycol isocyanate)hexamethylene isocyanurate, EO-modified urethane di(meth)acrylates, EO,PO-modified urethane di(meth)acrylates, and the like.

As an example of an EO-modified urethane di(meth)acrylate compound there may be mentioned UA-11 (product of Shin-Nakamura Chemical Co., Ltd.). As an example of an EO,PO-modified urethane di(meth)acrylate compound there may be mentioned UA-13 (product of Shin-Nakamura Chemical Co., Ltd.). These may be used alone or in combinations of two or more.

As examples of nonylphenoxypolyethylene oxyacrylate compounds there may be mentioned nonylphenoxytetraethylene oxyacrylate, nonylphenoxypentaethylene oxyacrylate, nonylphenoxyhexaethylene oxyacrylate, nonylphenoxyheptaethylene oxyacrylate, nonylphenoxyoctaethylene oxyacrylate, nonylphenoxynonaethylene oxyacrylate, nonylphenoxydecaethylene oxyacrylate, nonylphenoxyundecaethylene oxyacrylate and the like. These may also be used either alone or in combinations of two or more.

As phthalic acid-based compounds there may be mentioned g-chloro-b-hydroxypropyl-b'-(meth)acryloyloxy-ethyl-o-phthalate, b-hydroxyalkyl-b'-(meth)acryloyloxy-alkyl-o-phthalate and the like. These may likewise be used alone or in combinations of two or more.

The content of component (B) is preferably 20-80 parts by weight and more preferably 30-70 parts by weight with respect to 100 parts by weight as the total of component (A) and component (B). A content of less than 20 parts by weight will tend to result in insufficient photosensitivity of the photosensitive resin composition. A content exceeding 80 parts by weight will tend to render the photocured sections of the photosensitive layer fragile, and result in poor coated film properties when used as a photosensitive element.

The photopolymerization initiator used as component (C) will now be explained. The photopolymerization initiator used for the invention may be any compound that initiates and/or accelerates photopolymerization of the photopolymerizing compound, i.e. it is a compound that functions as a sensitizing agent.

As examples of component (C) of the invention there may be mentioned aromatic ketones such as 4,4'-bis(diethylamine)benzophenone, benzophenone and 2-benzyl-2-dimethylamino-1-(4-morpholinophenyl)-butanone-1,2-methyl-1-[4-(methylthio)phenyl]-2-morpholino-propanone-1; quinones such as alkylanthraquinones; benzoin compounds such as benzoin and alkylbenzoin; benzoinether compounds such as benzoinalkyl ether; benzyl derivatives such as benzyldimethylketal; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; acridine derivatives such as 9-phenylacridine, 1,7-bis(9,9'-acridinyl)heptane; N-phenylglycine, N-phenylglycine derivatives, and coumarin-based compounds such as 7-diethylamino-4-methylcoumarin. The two aryl-substituted groups of the aforementioned 2,4,5-triarylimidazole dimers may be identical to form a symmetrical compound, or they may be different to form an asymmetrical compound.

Component (C) of the invention contains a 2,4,5-triarylimidazole dimer or its derivative. These photopolymerization initiators (sensitizing agents) may be used alone or in combinations of two or more. From the viewpoint of further enhancing the sensitivity, it is preferred to use a coumarin-based compound as component (C) in addition to the 2,4,5-triarylimidazole dimer or its derivative that is used in combination with component (D) described hereunder.

The content of the 2,4,5-triarylimidazole dimer or its derivative as component (C) is preferably 0.1-10 parts by weight, more preferably 0.5-6 parts by weight and even more preferably 1-4 parts by weight with respect to 100 parts by weight as the total of component (A) and component (B). If the content is less than 0.1 part by weight the adhesiveness and sensitivity will tend to be insufficient, while if it is greater than 10 parts by weight the curability of the bottom section of the resist will tend to be reduced.

Compounds represented by general formula (1) as component (D) will now be explained.

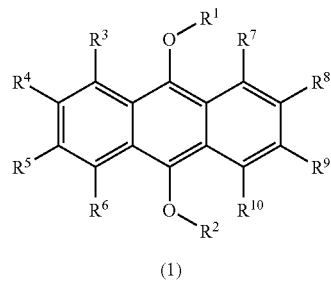

[Chemical Formula 2]

(1)

In formula (1), $R^1$ and $R^2$ each independently represent a C1-20 alkyl, C5-12 cycloalkyl, phenyl, benzyl, C2-12 alkanoyl or benzoyl group. $R^3$-$R^{10}$ each independently represent hydrogen, C1-12 alkyl, a halogen atom, cyano, carboxyl, phenyl, C2-6 alkoxycarbonyl or benzoyl. When the aforementioned C1-20 alkyl group is a C2-12 alkyl group, it may have an oxygen atom between the main chain carbon atoms, and may be substituted with hydroxyl. The C5-12 cycloalkyl group may have an oxygen atom in the ring and may be substituted with hydroxyl. A phenyl group for $R^1$ and $R^2$ may be optionally substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl. A benzyl group may be optionally substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl. A benzoyl group may also be optionally substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl.

The photosensitive resin composition of the invention which contains component (D) is useful for formation of resist patterns by exposure to light having a peak in the wavelength range of 350 nm to 440 nm.

As examples of $R^1$ and $R^2$ in component (D) there may be mentioned methyl, ethyl, propyl, butyl, pentyl, hexyl and the like. Examples of combinations of $R^1$ and $R^2$ include a combination of ethyl groups, a combination of propyl groups and a combination of butyl groups.

As examples of $R^3$-$R^{10}$ there may be mentioned hydrogen, methyl, ethyl, propyl, butyl, pentyl, hexyl, propenyl, butenyl, pentenyl, hexenyl, heptenyl, ethoxycarbonyl, hydroxyethoxycarbonyl and phenoxy. Combinations of $R^3$-$R^{10}$ include a combination of all hydrogens, a combination of one group as methyl, ethyl, propyl, butyl, pentyl, hexyl, propenyl, butenyl, pentenyl, hexenyl, heptenyl, ethoxycarbonyl, hydroxyethoxycarbonyl or phenoxy and the rest hydrogens; and a combination of two groups as methyl, ethyl, propyl, butyl, pentyl, hexyl, propenyl, butenyl, pentenyl, hexenyl, heptenyl, ethoxycarbonyl, hydroxyethoxycarbonyl or phenoxy, or a combination thereof, and the rest hydrogens.

As specific compounds represented by general formula (1) for component (D) there may be mentioned 9,10-dimethoxyanthracene, 9,10-diethoxyanthracene and 9,10-dibutoxyanthracene.

The content of component (D) is preferably 0.01-10 parts by weight, more preferably 0.05-5 parts by weight and most preferably 0.1-2 parts by weight with respect to 100 parts by weight as the total of component (A) and component (B). A content of less than 0.01 part by weight will tend to prevent satisfactory sensitivity and resolution from being obtained, while a content of greater than 10 parts by weight will tend to prevent a satisfactory pattern form from being obtained.

The photosensitive resin composition of the invention may also contain components other than components (A)-(D) mentioned above, if necessary. As such components there may be mentioned photopolymerizing compounds with at least one cationic polymerizable cyclic ether group in the molecule (oxetane compounds, etc.), cationic polymerization initiators, dyes such as malachite green, photochromogens such as tribromophenylsulfone and leuco crystal violet, thermal development inhibitors, plasticizers such as p-toluenesulfonamide, pigments, fillers, antifoaming agents, flame retardants, stabilizer, tackifiers, leveling agents, release promoters, antioxidants, aromas, imaging agents, thermal crosslinking agents and the like. These may be added in amounts that do not hinder the purpose of the invention. The components may be added at about 0.01-20 parts by weight each with respect to 100 parts by weight as the total of component (A) and component (B). They may be used alone or in combinations of two or more.

The photosensitive resin composition of the invention may be used as a solution in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, at a solid content of about 30-60 wt %. The solution may be used as a coating solution for formation of a photosensitive layer on a photosensitive element.

The coating solution may be used to form a photosensitive layer on a photosensitive element by application and drying on a support film as described hereunder, and for example, it may be applied as a liquid resist onto the surface of a metal sheet, for example, an iron-based alloy such as copper, copper-based alloy, nickel, chromium, iron, stainless steel or the like, and preferably onto the surface of copper, a copper-based alloy or an iron-based alloy, and then dried and covered with a protective film.

A photosensitive element according to the invention will now be explained. FIG. 1 is a schematic cross-sectional view showing a preferred embodiment of a photosensitive element of the invention. The photosensitive element 1 shown in FIG. 1 comprises a support film 10 and a photosensitive layer 14 composed of the photosensitive resin composition formed on the support film 10, and it may further comprise a protective film (not shown) covering the photosensitive layer 14.

The support film 10 may be a polymer film having heat resistance and solvent resistance, such as polyethylene terephthalate, polypropylene, polyethylene or polyester, for example. The thickness of the support film 10 (polymer film) is preferably 1-100 μm. If the thickness is less than 5 μm the support film 10 will be prone to tearing during release of the support film 10, and if it is greater than 25 μm the resolution will tend to be lower. Incidentally, one support film 10 may be used as the support for the photosensitive layer 14 while another one is used as a protective film for the photosensitive resin composition, thus being laminated on both sides of the photosensitive layer 14.

The protective film may be a polymer film having heat resistance and solvent resistance, such as polyethylene terephthalate, polypropylene, polyethylene or polyester, for example. As examples of commercially available products there may be mentioned "ALFAN MA-410" and "E-200C" by Oji Paper Co., Ltd., polypropylene films by Shin-Etsu Film Co., Ltd. or polyethylene terephthalate films of the PS series such as "PS-25" by Teijin, Ltd., but there is no restriction to these. The thickness of the protective film is preferably 1-100 μm, more preferably 5-50 μm, even more preferably 5-30 μm and most preferably 15-30 μm. If the thickness is less than 1 μm the protective film will tend to tear during lamination, while if it is greater than 100 μm the cost of the film will be increased. The protective film is preferably one such that the adhesive force between the photosensitive layer 14 and the protective film is lower than the adhesive force between the support film 10 and the photosensitive layer 14, and it is also preferably a low-fisheye film. Fisheyes are contaminants, insoluble matter and oxidative degradation products that become incorporated into films during their production by heat-fusion, kneading, extrusion, biaxial stretching and casting of film materials.

The photosensitive layer 14 is preferably formed by dissolving the photosensitive resin composition of the invention in a solvent as described above to make a solution (coating solution) with a solid content of about 30-60 wt % and then applying the solution (coating solution) onto the support film 10 and drying it. The coating may be accomplished by a publicly known method using, for example, a roll coater, comma coater, gravure coater, air knife coater, die coater, bar coater or the like. The drying may be accomplished at 70-150° C. for about 5-30 minutes. The amount of residual organic solvent in the photosensitive resin composition is preferably no greater than 2 wt % with respect to the total weight of the photosensitive resin composition, from the viewpoint of preventing diffusion of the organic solvent in subsequent steps. The thickness of the photosensitive layer 14 will differ depending on the use, but the post-drying thickness is preferably 1-100 μm and more preferably 1-50 μm. A thickness of less than 1 μm will tend to hamper industrial coating, while a thickness of greater than 100 μm will tend to reduce the effect of the invention and lower the adhesive force and resolution.

The photosensitive layer 14 preferably has an absorbance of 0.1-3, more preferably 0.15-2 and most preferably 0.2-1.5 for ultraviolet rays with a wavelength of 365 nm to 405 nm. An absorbance of less than 0.1 will tend to result in inferior sensitivity, while an absorbance of greater than 3 will tend to result in inferior adhesiveness. The absorbance may be measured by a UV spectrometer, where the UV spectrometer may be a Model 228A W Beam spectrophotometer by Hitachi, Ltd.

The photosensitive element 1 may also comprise interlayers such as a cushion layer, adhesive layer, photoabsorbing layer and gas barrier layer as necessary. The obtained photosensitive element 1 may be stored as a sheet or as a roll wound up on a winding core. In the latter case, it is preferably wound with the support on the outermost side. An edge separator is preferably situated at the edge of the photosensitive element 1 roll from the viewpoint of edge protection, while from the viewpoint of preventing edge fusion, the edge separator is preferably moisture-proof. The packaging method is preferably one that involves bundling in a black sheet with low moisture permeability. As examples for the winding core there may be mentioned plastics such as polyethylene resin, polypropylene resin, polystyrene resin, polyvinyl chloride resin, ABS resin (acrylonitrile-butadiene-styrene copolymer) and the like.

A resist pattern forming method using the photosensitive element 1 of the invention will now be explained. A first resist pattern forming method comprises a photosensitive layer forming step in which a photosensitive layer made of the photosensitive resin composition is formed on a circuit-forming board, an exposure step in which prescribed sections of the photosensitive layer are exposed to light having a peak in the wavelength range of 350 nm to 440 nm, and a developing step in which the exposed photosensitive layer is developed to form a resist pattern. A circuit-forming board is a board comprising an insulating layer and a conductive layer formed on the insulating layer.

In the photosensitive layer forming step, when using a photosensitive element 1 as described above, the protective film is slowly released from the photosensitive layer 14 and the section of the photosensitive layer 14 surface that is gradually exposed thereby is bonded onto the side of a circuit-forming board on which a circuit is to be formed. When forming the resist pattern, it is preferred to employ a method of first removing the protective film and contact bonding the photosensitive layer 14 onto the circuit-forming board with a pressure of about 0.1-1 MPa (about 1-10 kgf/cm$^2$) while heating at about 70-130° C. to accomplish lamination; a method of lamination under reduced pressure is also preferred from the viewpoint of improving the adhesiveness and follow-up property (lamination step). If the photosensitive layer 14 is heated at 70-130° C. as mentioned above it is not necessary to subject the circuit-forming board to pre-heating, but the circuit-forming board may also be preheated for further enhanced laminating properties.

In the exposure step mentioned above, active light rays are irradiated into an image through a negative or positive mask pattern known as artwork (mask exposure process). When the support film 10 on the photosensitive layer 14 is transparent to the active light rays, the active light rays can be irradiated through the support film 10 in the exposure step, or when the support film 10 is non-transparent, the active light rays may be irradiated onto the photosensitive layer 14 after removal of the support film 10. The active light rays may also be irradiated into an image by a direct writing method such as laser direct writing exposure or DLP (Digital Light Processing) exposure.

The light source for the active light rays may be a publicly known light source such as, for example, a carbon arc lamp, mercury vapor arc lamp, high pressure mercury lamp, xenon lamp, Ar ion laser, semiconductor laser or the like, which efficiently emits ultraviolet rays or visible light. According to the invention, it is preferred to use active light rays from which at least 99.5% of light with a wavelength of up to 365 nm emitted from a mercury lamp light source has been cut using a filter, or semiconductor laser light with a wavelength of 405 nm. Examples of filters that may be used to cut light with a wavelength of up to 365 nm include the sharp cut filter SCF-100S-39 L (product of Sigma Koki Co., Ltd.).

When exposure is accomplished by the direct writing method described above, a DE-1AH by Hitachi Via Mechanics, Ltd., for example, may be used. Since this light source is a 405 nm LD (laser diode), there is no need to use a sharp cut filter. Also, no phototool need be used since direct exposure is performed.

For the developing step, if the support is on the photosensitive layer it is removed before removing and developing the non-photocured sections (unexposed sections) by wet development or dry development to form the resist pattern.

The developing solution used for wet development may be an aqueous alkali solution, aqueous developing solution or organic solvent that is safe, stable and manageable, depending on the type of photosensitive resin composition. The development method may be any known method such as spraying, reciprocal dipping, brushing, scrapping or the like, as appropriate.

As safe, stable and manageable bases for an aqueous alkali solution there may be used lithium hydroxide, sodium hydroxide and potassium hydroxide, which are hydroxides of alkali metals such as lithium, sodium and potassium; alkali carbonates or alkali bicarbonates, as carbonic acid salts or bicarbonic acid salts of alkali metals or ammonium; sodium phosphate and potassium phosphate, which are phosphoric acid salts of alkali metals; or sodium pyrophosphate and potassium pyrophosphate, which are pyrophosphoric acid salts of alkali metals.

Preferred aqueous alkali solutions of such types are, for example, a 0.1-5 wt % sodium carbonate dilute solution, 0.1-5 wt % potassium carbonate dilute solution, 0.1-5 wt % sodium hydroxide dilute solution or 0.1-5 wt % sodium tetraborate dilute solution, preferably with a pH in the range of 9-11. The temperature of the aqueous alkali solution is adjusted according to the developing property of the photosensitive layer 14. The aqueous alkali solution may also contain small amounts of organic solvents such as surfactants or defoaming agents, to accelerate development.

An aqueous developing solution used is composed of water and an aqueous alkali solution or one or more different organic solvents. The base of the aqueous alkali solution in this case may be borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine or the like, in addition to the bases mentioned above. The pH of such an aqueous developing solution is preferably as low as possible within a range allowing sufficient developing treatment, and it is preferably pH 8-12 and more preferably pH 9-10.

As examples of organic solvents there may be mentioned, acetone, ethyl acetate, alkoxyethanols with C1-4 alkoxy groups, ethyl alcohol, isopropyl alcohol, butyl alcohol, diethyleneglycol monomethyl ether, diethyleneglycol monoethyl ether and diethyleneglycol monobutyl ether. The preferred concentration of such organic solvents will usually be 2-90 wt %. The temperature of the organic solvent may be adjusted according to the developing property. Also, the organic solvents mentioned above may be used alone or in combinations of two or more. As examples of organic solvent-based developing solutions to be used alone there may be mentioned 1,1,1-trichloroethane, N-methylpyrrolidone, N,N-dimethylformamide, cyclohexanone, methyl isobutyl ketone, γ-butyrolactone and the like. The aqueous alkali solution may also contain small amounts of organic solvents such as surfactants or defoaming agents, to accelerate development. In such cases, water is preferably added to the organic solvent(s) in a range of 1-20 wt % for anti-flammability.

For the resist pattern forming method of the invention, two or more of the aforementioned developing methods may be carried out simultaneously as necessary. The developing system may be a dip system, paddle system, spray system, brushing system, slapping system or the like, but a high-pressure spray system is most suitable for improved resolution. Post-development treatment may consist of heating at about 60-250° C. or exposure at about 0.2-10 mJ/cm$^2$ if necessary for further curing of the resist pattern. A cupric chloride solution, ferric chloride solution, alkali etching solution or the like may be used for etching of the metal side after development.

A second resist pattern forming method will now be explained. The second resist pattern forming method is similar to the first resist pattern forming method, except that a plasma display panel board with a barrier material layer formed thereon is used instead of the circuit-forming board used in the first resist pattern forming method.

The plasma display board may be, for example, a PD-200 (trade name of Asahi Glass Co., Ltd.). The barrier material layer is formed using, for example, a RPW401 (trade name of Asahi Glass Co., Ltd.).

The printed circuit board production process of the invention will now be explained. The printed circuit board production process of the invention comprises a photosensitive layer forming step in which a photosensitive layer made of the photosensitive resin composition is formed on a circuit-forming board, an exposure step in which prescribed sections of the photosensitive layer are exposed to light having a peak in the wavelength range of 350 nm to 440 nm, a developing step in which the exposed photosensitive layer is developed to form a resist pattern, and a conductor pattern forming step in which a conductor pattern is formed on the circuit-forming board based on the resist pattern. A circuit-forming board is a board comprising an insulating layer and a conductive layer formed on the insulating layer.

In the printed circuit board production process of the invention, the surface of a circuit-forming board is etched or plated using as the mask a resist pattern obtained by the first resist pattern forming method of the invention.

A cupric (II) chloride solution, ferric chloride solution, alkali etching solution or hydrogen peroxide etching solution, for example, may be used for etching of the surface of the circuit-forming board, with a ferric chloride solution being preferred among these because of its satisfactory etch factor.

The plating treatment referred to above may employ an appropriate known process such as copper plating treatment including copper sulfate plating and copper pyrophosphate plating; solder plating treatment including high throw plating; nickel plating treatment including Watt bath (nickel sulfate-nickel chloride) plating and nickel sulfaminate treatment; and gold plating treatment including hard gold plating and soft gold plating.

In the printed circuit board production process of the invention, the resist pattern may then be released and removed using an aqueous solution that is stronger than the aqueous alkali solution used for development. The strongly alkaline aqueous solution used here may be, for example, a 1-10 wt % sodium hydroxide aqueous solution or a 1-10 wt % potassium hydroxide aqueous solution. The system for releasing and removal of the resist pattern may be a dipping system or spraying system, for example, and a dipping or spraying system may be used either alone or in combination.

The printed circuit board production process of the invention as described above may be applied not only to production of single-layer printed circuit boards, but also to production of multilayer printed circuit boards, while it may also be applied to production of printed circuit boards with miniature through-holes.

A plasma display panel barrier production process will now be explained. The plasma display panel barrier production comprises a photosensitive layer forming step in which a photosensitive layer made of the photosensitive resin composition is formed on the barrier material layer of a plasma display panel board, an exposure step in which prescribed sections of the photosensitive layer are exposed to light having a peak in the wavelength range of 350 nm to 440 nm, a developing step in which the exposed photosensitive layer is developed to form a resist pattern, and a barrier pattern forming step in which a barrier pattern is formed on the board by etching, based on the resist pattern.

The plasma display panel board and barrier material layer are the same types as used for the second resist pattern forming method described above.

That is, in this plasma display panel barrier production process a resist pattern obtained by the second resist pattern forming method is used as the mask for etching of the barrier material layer.

The method of etching the barrier material layer may be, for example, a sand blast method or wet etching method. For a sand blast method, shaved particles of silica or alumina, for example, are directly blown onto the board for etching of the barrier material. For a wet etching method, an acid solution such as nitric acid is used for etching of the barrier material.

The invention will now be explained in greater detail by the following examples. However, the invention is not limited to the examples that are provided below, and the invention may also be applied in a variety of other modes so long as the gist thereof is maintained.

EXAMPLES

The invention will now be explained in greater detail by examples and comparative examples. This is with the understanding, however, that the invention is not limited to these examples.

Examples 1-9 and Comparative Examples 1-5

Preparation of Photosensitive Resin Composition

First, the components listed in Table 1 were combined in the amounts (g) shown in the table to obtain solutions.

TABLE 1

| | Starting materials | Content (g) |
|---|---|---|
| Component (A) | Methacrylic acid/methyl methacrylate/styrene (25/50/25 (wt. ratio), wt. av. mol. wt.: 30,000), methyl cellosolve/toluene = 3/2 (wt. ratio) solution, solid portion acid value = 163 mgKOH/g | 113 (solid wt.: 54) |
| Component (B) | FA-321M*[1] | 46 |
| Chromogen | Leuco crystal violet | 0.3 |
| Dye | Malachite green | 0.03 |
| Solvent | Acetone | 9 |
| | Toluene | 5 |
| | Methanol | 5 |

*[1]EO-modified bisphenol A dimethacrylate represented by the following general formula (3) ("FA-321 M" by Hitachi Chemical Co., Ltd.). In general formula (3), the condition m + n = 10 (mean value) is assumed.

[Chemical Formula 3]

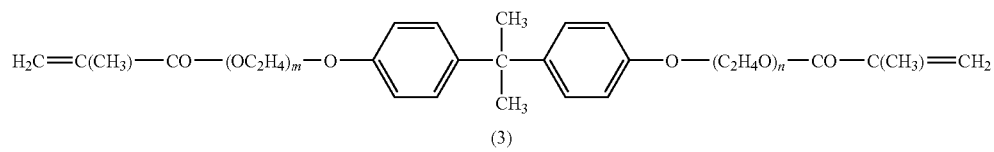

(3)

sections of the photosensitive layer are exposed to light having a peak in the wavelength range of 350 nm to 440 nm, a developing step in which the exposed photosensitive layer is developed to form a resist pattern, and a barrier pattern form- Next, DBA as component (D) and C1 as component (C), listed in Table 2, were dissolved in the obtained solutions in the amounts (g) shown in the table to obtain photosensitive resin composition solutions.

TABLE 2

|  |  | Examples | | | | | | | | |
|---|---|---|---|---|---|---|---|---|---|---|
|  |  | 1 | 2 | 3 | 4 | 5 | 6 | 7 | 8 | 9 |
| Component (D) | DBA*2 (g) | 1 | 0.25 | 0.5 | 0.3 | 0.5 | 0.7 | 0.6 | 0.8 | 1 |
| Component (C) | C1*3 (g) | 0 | 0.9 | 0.9 | 0.7 | 0.5 | 0.3 | 0 | 0 | 0 |
|  | HABI*4 (g) | 3.7 | 3.7 | 3.7 | 3.7 | 3.7 | 3.7 | 3.7 | 3.7 | 3.7 |

|  |  | Comparative Examples | | | | |
|---|---|---|---|---|---|---|
|  |  | 1 | 2 | 3 | 4 | 5 |
| Component (D) | DBA*2 (g) | 0 | 0 | 0 | 1 | 0 |
| Component (C) | C1*3 (g) | 0 | 0.9 | 0 | 0 | 0 |
|  | HABI*4 (g) | 3.7 | 3.7 | 3.7 | 0 | 3.7 |
|  | I-369*5 (g) | 0 | 0 | 0 | 8.0 | 0 |

*2 DBA: 9,10-Dibutoxyanthracene (maximum absorption wavelengths $\lambda_n$ = 368 nm, 388 nm, 410 nm)
*3 C1: 7-Diethylamino-4-methylcoumarin
*4 HABI: 2,2'-Bis(o-chlorophenyl)-4,4',5,5'-tetraphenylbisimidazole
*5 I-369: 2-Benzyl-2-dimethylamino-1-(4-morpholinophenyl)-butanone Examples 1-6 and Comparative Examples 1-4 will be described first.

(Fabrication of Photosensitive Elements)

Each of the photosensitive resin composition solutions obtained in Examples 1-6 and Comparative Examples 1-4 was evenly coated onto a 16 μm-thick polyethylene terephthalate film ("GS-16" by Teijin, Ltd.) as the support and dried for 10 minutes with a hot air convection drier at 70° C. and 100° C. to obtain a photosensitive element. The post-drying thickness of the photosensitive layer was 25 μm.

<Absorbance Test>

The optical density (O.D. value) of the photosensitive layer for the exposure wavelength was measured using an UV spectrophotometer ("U-3310 Spectrophotometer" by Hitachi, Ltd.). The reference used for the measurement was the same type of polyethylene terephthalate film as used for the support, and continuous measurement was performed in absorbance mode with light in a wavelength range of 550-300 nm to obtain an UV absorption spectrum, from which the value of absorbance at 405 nm was recorded as the O.D. value. The measurement results are shown in Table 3.

(Resist Pattern Formation)

Each of the obtained photosensitive elements was used for lamination of a photosensitive layer on a copper clad laminate by the following method to obtain a laminated body. Specifically, the copper surface of a copper clad laminate ("MCL-E-67" by Hitachi Chemical Co., Ltd.) comprising a glass epoxy material laminated on both sides with copper foil (35 mm thickness) was polished using a polishing machine with a #600-equivalent brush (Sankei Co., Ltd.), and after cleaning with water, it was dried with an air stream. The obtained copper clad laminate was heated to 80° C., and the photosensitive layer was laminated on the copper clad laminate at 120° C. under a pressure of 0.4 MPa while peeling off the photosensitive element protective film, to obtain a laminated body.

<Photosensitivity and Resolution Test>

Next, the laminated body was cooled to 23° C., and the surface of the polyethylene terephthalate film positioned on the outermost layer of the laminated body was laminated with a phototool having a density region of 0.00-2.00, a density step of 0.05 and a 41-step tablet with a tablet (rectangle) size of 20 mm×187 mm and a step (rectangle) size of 3 mm×12 mm, and a phototool having a wiring pattern with a line width/space width of 6/6-35/35 (units: mm) as a resolution evaluation negative, in that order. A sharp cut filter SCF-100S-39 L (trade name) by Sigma Koki Co., Ltd. that cuts at least 99.5% of light with a wavelength of up to 365 nm was situated thereover.

A balanced exposure optical device ("EXM-1201" by Orc Manufacturing Co., Ltd.) with a 5 kW short arc lamp as the source was used for exposure at an exposure dose to leave 17 steps after development of the 41-step tablet, and the exposure dose was recorded as the sensitivity. The illuminance measurement was conducted for light passing through the sharp cut filter using an ultraviolet illuminometer ("UIT-150" with "UVD-S405" photodetector, by Ushio Inc.) with a 405 nm probe, and the product of the illuminance and exposure time was recorded as the exposure dose. The results are shown in Table 3.

The polyethylene terephthalate film was then released, and 1 wt % aqueous sodium carbonate at 30° C. was sprayed for 24 seconds to remove the unexposed sections. The resolution was evaluated as the smallest value of the space width between line widths which allowed clean removal of the unexposed sections by developing treatment and produced lines without waviness or breaking. A smaller value is desirable for the sensitivity and resolution evaluation. The results are shown in Table 3.

The resist form after development was observed using a Hitachi S-500A Scanning Electron Microscope. The results are shown in Table 3.

Examples 7-9 and Comparative Example 5 will now be explained.

(Fabrication of Photosensitive Elements)

Each of the photosensitive resin composition solutions obtained in Examples 7-9 and Comparative Example 5 was evenly coated onto a 16 μm-thick polyethylene terephthalate film ("GS-16" by Teijin, Ltd.) as the support and dried for 10 minutes with a hot air convection drier at 70° C. and 100° C. to obtain a photosensitive element. The post-drying thickness of the photosensitive layer was 38 μm.

<Absorbance Test>

An absorbance test was conducted in the same manner as for Examples 1-6 and Comparative Examples 1-4. The measurement results are shown in Table 4.

(Resist Pattern Formation)

First, a rib paste material (RPW401 by Asahi Glass Co., Ltd.) was coated onto a plasma display panel board (PD200 by Asahi Glass Co., Ltd.) to form a barrier material layer. The photosensitive layer of the obtained photosensitive element was laminated onto the barrier material layer of the PDP board on which the barrier material layer had been formed, to obtain a laminated body. The PDP board on which the barrier material layer had been formed was heated to 80° C., and the photosensitive layer was laminated at 120° C. under a pressure of 0.4 MPa while peeling off the protective film of the photosensitive element.

<Photosensitivity and Resolution Test>

Photosensitivity and resolution tests were conducted in the same manner as for Examples 1-6 and Comparative Examples 1-4, giving the measurement results shown in Table 3 and Table 4.

TABLE 3

|  | Examples | | | | | |
|---|---|---|---|---|---|---|
|  | 1 | 2 | 3 | 4 | 5 | 6 |
| DBA (g) | 1 | 0.25 | 0.5 | 0.3 | 0.5 | 0.7 |
| C1 (g) | 0 | 0.9 | 0.9 | 0.7 | 0.5 | 0.3 |
| HABI (g) | 3.7 | 3.7 | 3.7 | 3.7 | 3.7 | 3.7 |

TABLE 3-continued

| Absorbance (405 nm) | 0.55 | 0.7 | 0.84 | 0.57 | 0.58 | 0.56 |
|---|---|---|---|---|---|---|
| Sensitivity (mJ/cm$^2$) | 80 | 73 | 69 | 55 | 60 | 56 |
| Resolution (μm) | 16 | 14 | 16 | 16 | 14 | 14 |
| Resist form | Rect-angular | Rect-angular | Rect-angular | Rect-angular | Rect-angular | Rect-angular |

| | Comparative Examples | | | |
|---|---|---|---|---|
| | 1 | 2 | 3 | 4 |
| DBA (g) | 0 | 0 | 0 | 1 |
| C1 (g) | 0 | 0.9 | 0 | 0 |
| HABI (g) | 3.7 | 3.7 | 3.7 | 0 |
| I-369 (g) | 0 | 0 | 0 | 8.0 |
| EAB*[6] | 0 | 0 | 0.5 | 0 |
| Absorbance (405 nm) | 0.06 | 0.59 | 0.49 | 0.93 |
| Sensitivity (mJ/cm$^2$) | 656 | 117 | 148 | 242 |
| Resolution (μm) | 18 | 16 | 18 | 25 |
| Resist form | Rect-angular | Rect-angular | Rect-angular | Rect-angular |

*[6]EAB: 4,4'-Bis(diethylamino)benzophenone

TABLE 4

| | Examples | | | Comparative Example |
|---|---|---|---|---|
| | 7 | 8 | 9 | 5 |
| DBA (g) | 0.6 | 0.8 | 1 | 0 |
| C1 (g) | 0 | 0 | 0 | 0 |
| HABI (g) | 3.7 | 3.7 | 3.7 | 3.7 |
| Absorbance (405 nm) | 0.404 | 0.565 | 0.632 | 0.100 |
| Sensitivity (mJ/cm$^2$) | 24.7 | 19.5 | 16.7 | 680 |
| Resolution (μm) | 40 | 40 | 60 | 70 |
| Resist form | Rect-angular | Rect-angular | Rect-angular | Rect-angular |

INDUSTRIAL APPLICABILITY

According to the invention there are provided a photosensitive resin composition that allows formation of resist patterns with light having a wavelength of 390 nm to 440 nm, at sufficient sensitivity and resolution, and a photosensitive element, resist pattern forming method, printed circuit board production process and plasma display panel barrier production process using it.

The invention claimed is:

1. A printed circuit board production process comprising the steps of:
   (A) forming a photosensitive layer of a photosensitive element on a board, wherein the photosensitive layer comprises a photosensitive resin composition, wherein the photosensitive resin composition comprises
   (a) a binder polymer;
   (b) a photopolymerizing compound with a polymerizable ethylenic unsaturated bond;
   (c) a photoradical polymerization initiator containing a 2,4,5-triarylimidazole dimer or a derivative thereof; and
   (d) a compound represented by the following general formula (1)

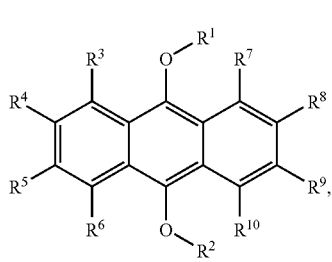

wherein $R^1$ and $R^2$ each independently represent a C1-20 alkyl, C5-12 cycloalkyl, phenyl, benzyl, C2-12 alkanoyl or benzoyl group; $R^3$, $R^4$, $R^5$, $R^6$, $R^7$, $R^8$, $R^9$ and $R^{10}$ each independently represent hydrogen, C1-12 alkyl, a halogen atom, cyano, carboxyl, phenyl, C2-6 alkoxycarbonyl or benzoyl;
   wherein the C5-12 cycloalkyl group may have an oxygen atom in the ring and may be substituted with hydroxyl;
   a phenyl group for $R^1$ and $R^2$ may be optionally substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl;
   a benzyl group may be optionally substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl; and
   a benzoyl group may be optionally substituted with one or more groups and/or atoms selected from the group consisting of C1-6 alkyl, hydroxyl, halogen atoms, cyano, carboxyl, phenyl, C1-6 alkoxy, phenoxy and C2-6 alkoxycarbonyl, wherein the weight average molecular weight of the binder polymer is 5000-300,000, and wherein the content of the compound represented by the general formula (1) is 0.01-10 parts, by weight, with respect to 100 parts, by weight, as the total of the binder polymer and the photopolymerizing compound;
   (B) exposing a plurality of sections of the photosensitive layer to light having a peak in the wavelength range of 390 nm to 440 nm;
   (C) developing the exposed photosensitive layer to form a resist pattern; and
   (D) forming a conductor pattern on the board based on the resist pattern.

2. A printed circuit board production process as recited by claim 1, wherein when the aforementioned C1-20 alkyl group is a C2-12 alkyl group, the C2-12 alkyl group may have an oxygen atom between the main chain carbon atoms, and may be substituted with hydroxyl.

* * * * *